United States Patent [19]

Mahler

[11] Patent Number: 5,658,114

[45] Date of Patent: Aug. 19, 1997

[54] MODULAR VACUUM SYSTEM FOR THE TREATMENT OF DISK-SHAPED WORKPIECES

[75] Inventor: Peter Mahler, Hainburg, Germany

[73] Assignee: Leybold Aktiengesellschaft, Hanau, Germany

[21] Appl. No.: 388,923

[22] Filed: Feb. 15, 1995

[30] Foreign Application Priority Data

May 5, 1994 [DE] Germany ................ 9407482 U

[51] Int. Cl.⁶ .................................................. F16J 12/00
[52] U.S. Cl. ........................................ 414/217; 414/939
[58] Field of Search ............................. 414/217, 939;
118/719; 204/298.25

[56] References Cited

U.S. PATENT DOCUMENTS

| | | | |
|---|---|---|---|
| 4,045,435 | 8/1977 | Tateishi et al. | 414/217 |
| 4,358,472 | 11/1982 | Small et al. | 427/10 |
| 4,400,409 | 8/1983 | Izu et al. | 427/39 |
| 4,423,701 | 1/1984 | Nath et al. | 118/715 |
| 4,462,332 | 7/1984 | Nath et al. | 118/718 |
| 4,492,181 | 1/1985 | Ovshinsky et al. | 118/718 |
| 4,677,738 | 7/1987 | Izu et al. | 29/572 |
| 4,701,251 | 10/1987 | Beardow | 414/217 |
| 4,825,808 | 5/1989 | Takahashi et al. | 414/217 |
| 5,090,900 | 2/1992 | Rudolf et al. | 423/239 |
| 5,223,113 | 6/1993 | Kaneko et al. | 204/298 |
| 5,275,709 | 1/1994 | Anderle et al. | 414/217 |
| 5,346,513 | 9/1994 | Taniguchi | 29/25.01 |

FOREIGN PATENT DOCUMENTS

| | | |
|---|---|---|
| 452778 | 10/1991 | European Pat. Off. . |
| 575055 | 12/1993 | European Pat. Off. . |
| 243050 | 2/1987 | Germany . |
| 9113860 | 1/1992 | Germany . |

*Primary Examiner*—Thomas J. Brahan
*Attorney, Agent, or Firm*—Felfe & Lynch

[57] ABSTRACT

Modular vacuum system includes functional units arranged in tandem to form two parallel transport paths which connect at one end of the system. Each unit includes a housing milled from a single block of metal having external walls, an internal wall, and side-by-side openings which align with side-by-side openings in an adjacent unit.

4 Claims, 3 Drawing Sheets

MODULAR VACUUM SYSTEM FOR THE TREATMENT OF DISK-SHAPED WORKPIECES

BACKGROUND OF THE INVENTION

The invention pertains to a functional unit for a vacuum system for the treatment of disk-shaped workpieces, comprising treatment chambers with openings in the chamber walls which can be sealed by swing valves; with holes for the leak-tight lead-through of the accessory equipment and connections required for the treatment of the workpieces such as electrodes for sputtering, glow discharge, and etching and lines for heating, process gas, and cooling; and with a transport device for conveying the workpieces through the treatment chamber.

U.S. Pat. No. 5,346,513 discloses semiconductor component production unit which has a carrier chamber with a hexagonal outline. Several reaction chambers and several replacement chambers are flanged to the side walls of the carrier chamber, and a manipulator is provided to convey the workpieces through the functional chambers.

U.S. Pat. No. 5,090,900 discloses a vacuum system for the treatment of workpieces which comprises at least one process chamber for the workpieces and a central distribution chamber is also known. The workpieces are fed into the distribution chamber through locks by means of a transport mechanism and removed again after treatment. An intermediate chamber, which can be evacuated, is installed between the distribution chamber and the process chamber, at least one of which is provided.

European Patent No. 452,778 discloses individual process chambers flanged to the side walls of a polygonal main chamber. A manipulator housed in the main chamber transports the workpieces from the first to the next treatment chamber. This prior functional unit is made of pieces of sheet metal. The pieces are designed in such a way that the entire unit can be assembled with a minimum of welds.

A disadvantage of all these known functional units is that the individual chambers are assembled from a large number of cut sections of sheet metal or individual castings. This means that the fabrication process is laborintensive and thus cost-intensive. Another disadvantage is that a genuine modular construction system is not possible, because different coating processes also require different functional units, but these cannot be realized on the basis of the known polygonal main chamber, especially when a plurality of substrates, which are held in common by one substrate carrier, are to be treated simultaneously.

SUMMARY OF THE INVENTION

The task of the present invention is to create a functional unit which can be produced at very low cost and which is designed in such a way that it can be adapted to a wide variety of processing jobs especially in the case of in-line systems for data storage media.

This task is accomplished in accordance with the invention in that the functional unit has several functional chambers divided off from one another, such as distribution chambers, intermediate chambers, and coating chambers, these chambers being arranged along two parallel production routes either above or next to one another or possibly even at the two ends of the production routes, the overall functional unit itself being made of a single piece of material.

BRIEF DESCRIPTION OF THE DRAWINGS

FIG. 1A is an end section of the apparatus in FIG. 1;

FIG. 2A is an end section of the apparatus of FIG. 2; and

DETAILED DESCRIPTION OF THE PREFERRED EMBODIMENTS

Figure 1:
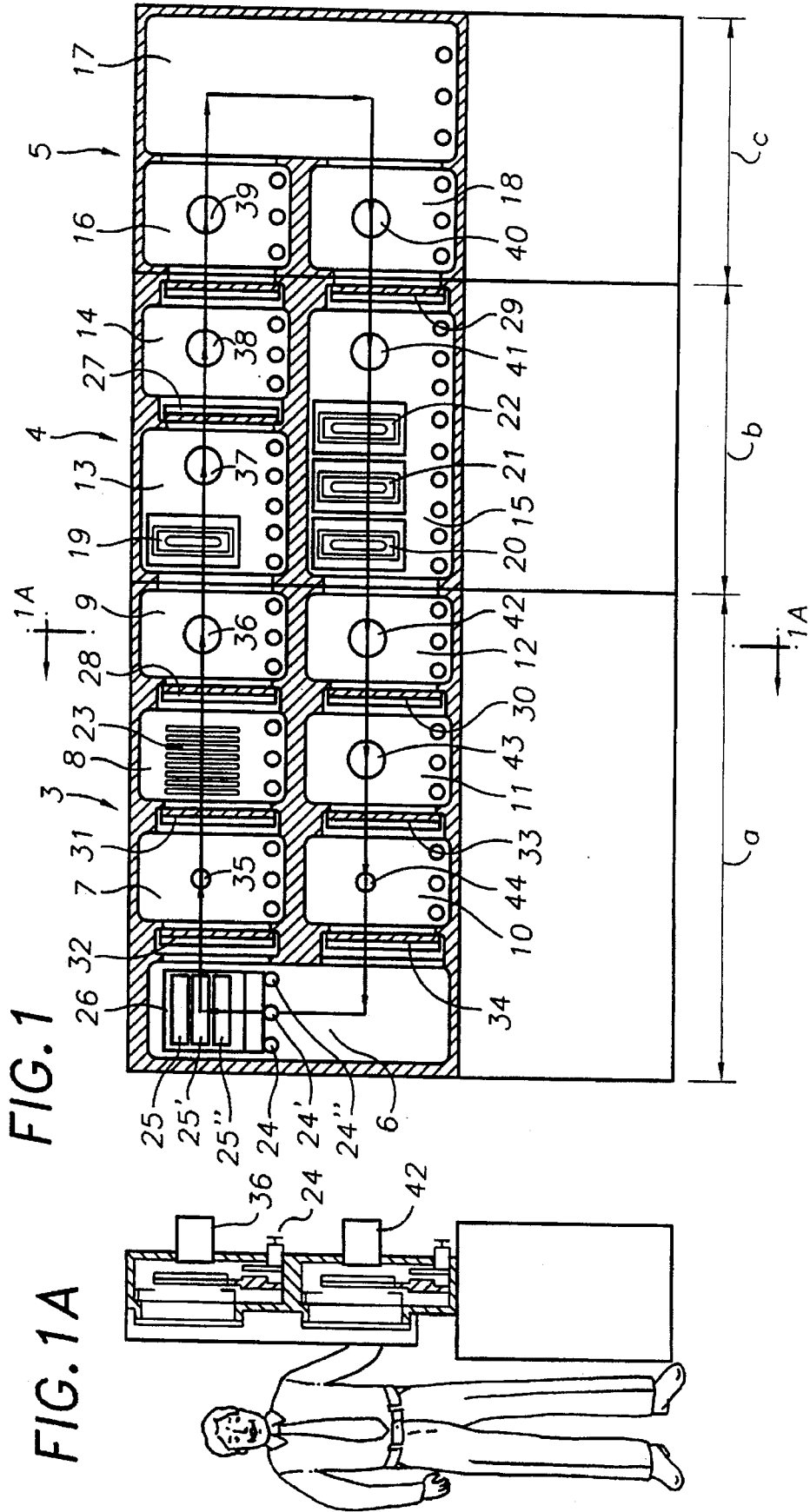
FIG. 1 is a schematic elevation cross section through three functional units removably connected to each other along a line.
Figure 2:
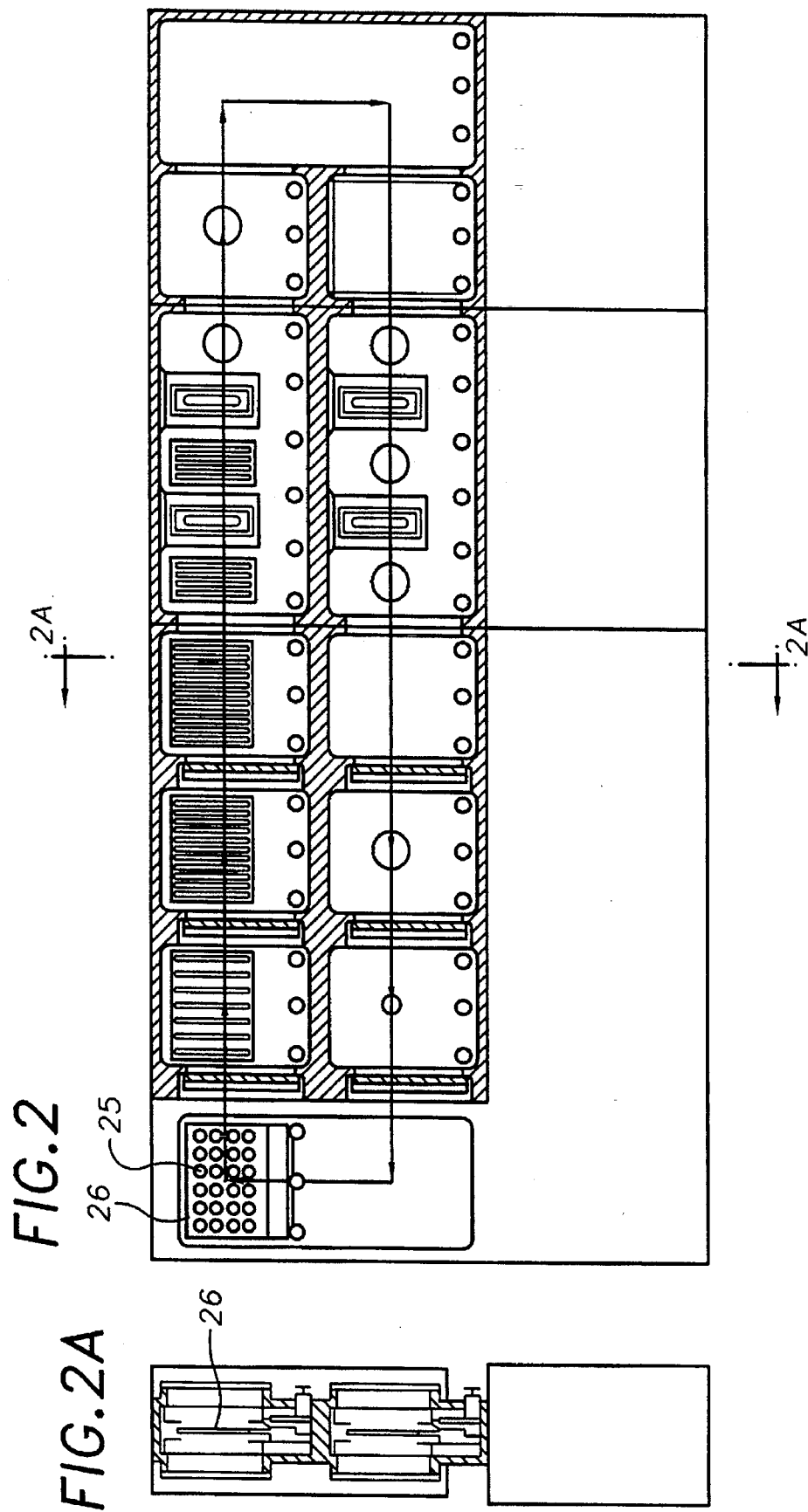
FIG. 2 is a schematic elevation section through an alternative apparatus made up of the same functional units.
Figure 3:
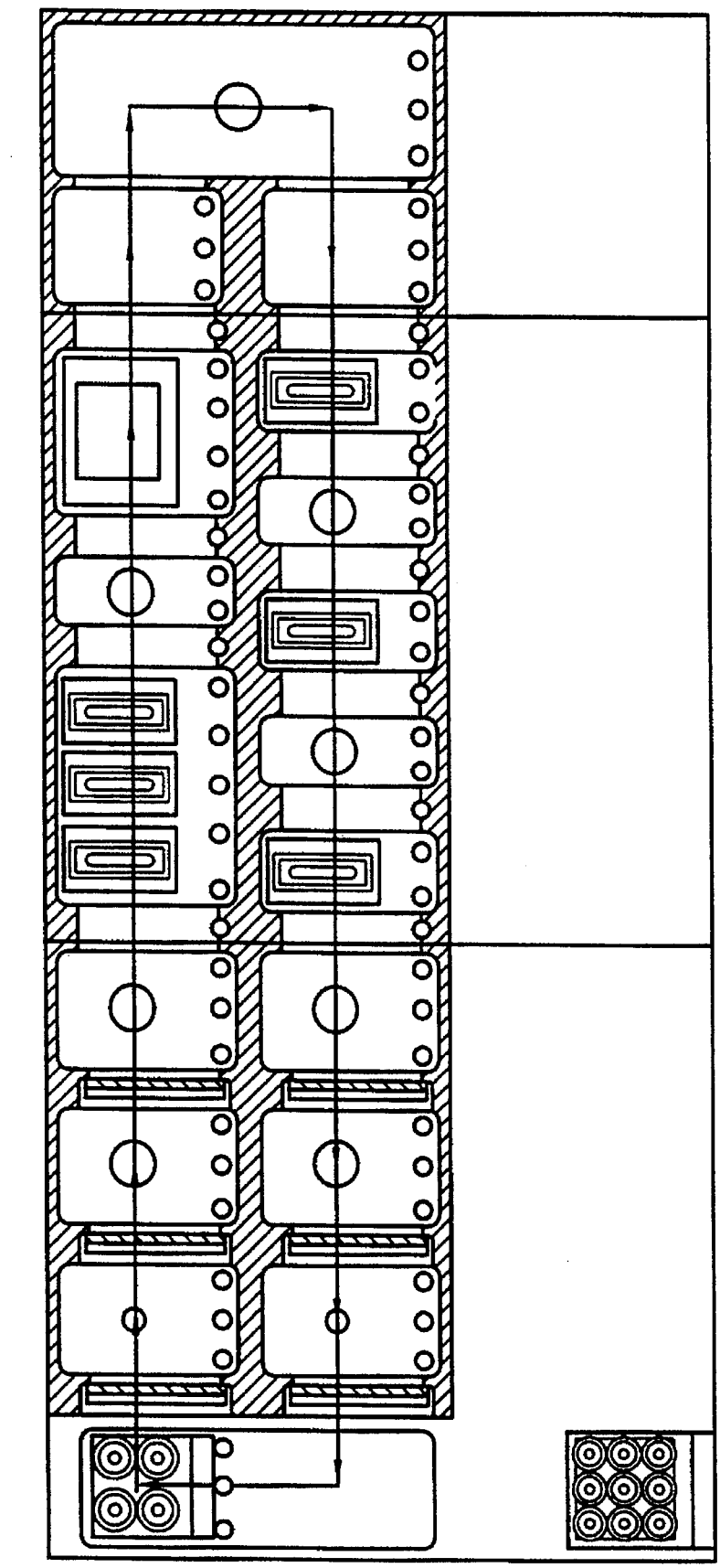
FIG. 3 is a schematic elevation section through a further alternative apparatus made up of the same function units.

The system shown in the drawing comprises three functional units 3, 4, 5, the adjacent end walls of which are screwed together. Each of these three functional units 3, 4, 5 is provided with several functional chambers 6–12, 13–15, and 16–18, respectively. In the individual functional chambers 6–18, sputter cathodes 19–22 or heating devices 23 are installed in correspondence with the treatment process to be carried out by the vacuum system. In addition, rollers 24, 24', . . . , supported in a rotatable manner, are installed in all functional chambers 6–18 to transport substrates 25, 25' . . . , which are vertically arranged on vertically oriented substrate holders 26, 26' . . . , these holders being moved by motor-driven rollers 24, 24', . . . in the direction of the arrow through functional chambers 6–18.

Whereas the first three chambers 7, 8, 9 are use to produce the preliminary vacuum and the high vacuum, chamber 13 is a coating chamber, in which substrates 25, 25', . . . are coated with, for example, $SiO_2$. This chamber 13 or chamber 9 upline from it can be separated from the other chambers by means of locks 27, 28. In the same way, chambers 12 and 15, in which substrates 25, can be coated with, for example, Al, are separated by locks 29, 30. With respect to feed lock chamber 6, locks 31, 32 and 33, 34 make it possible for the vacuum to be built up in stages, and locks 33, 34 make it possible for the vacuum to be stepped down. Chamber 17 is designed as a pure transport chamber, which serves to reverse the direction of substrate holders 26, 26', . . .

The three functional units 3, 4, 5 used in the exemplary embodiment illustrated are each made of a solid block of aluminum, the individual chambers having been milled out of the solid material of the block. In the same way, all the openings and holes 35–44 for the pump connections, process gas inlets, cooling water connections, and electrical terminals (none of which is shown in detail) are each milled out or drilled out of the solid aluminum block. It is advantageous that functional units 3, 4, 5 are designed in such a way that, by connecting the functional units of each of the three different types to each other in the number and sequence suitable for the specific application in question, they can be assembled to form practically any type of sputtering or etching system, e.g., a system for data storage.

As the drawings show, functional units 3, 4, 5 are of different lengths (a, b, c). Functional unit 3 has six chambers 7–12, which are all of the same size, and a chamber 6, which is twice as high and which is lined up with the openings in the two chambers 7, 10, which are stacked on top of each other. As a result of its double height, this chamber makes it possible for substrates 25, 25', . . . emerging in the direction of the arrow from chamber 10 to be discharged. Functional unit 5 at the other end of the coating system has a length of c; this unit makes it possible for the substrate carrier to reverse its direction (in the direction of the arrow) as it passes from chamber 16 by way of double-height chamber 17 into chamber 18.

What is claimed is:

1. Modular vacuum system comprising a plurality of functional units arranged in tandem, each functional unit comprising an internal wall which separates two parallel transport paths, at least one function chamber on each transport path, and external walls including a pair of opposed end walls situated transversely of said transport paths, said external walls and said internal wall being formed integrally from a single block of metal, said function chambers being milled in said block of metal, at least one of said end walls in each functional unit having a pair of side-by-side openings therethrough in alignment with said transport paths, said openings being connected sealingly to side-by-side openings in another said functional unit so that each transport path passes through a plurality of functional units.

2. Modular vacuum system as in claim 1 wherein, in at least one of said functional units, both of said end walls have side-by-side openings therethrough.

3. Modular vacuum system as in claim 1 wherein, in one of said functional units, only one of said end walls has side-by-side openings therethrough, said opposed end wall being closed, said parallel transport paths being connected by a transverse path inside said unit.

4. Modular vacuum system as in claim 1 wherein at least one of said functional units has a plurality of function chambers on each transparent path.

* * * * *